United States Patent
Vali et al.

(10) Patent No.: US 8,004,892 B2
(45) Date of Patent: *Aug. 23, 2011

(54) SINGLE LATCH DATA CIRCUIT IN A MULTIPLE LEVEL CELL NON-VOLATILE MEMORY DEVICE

(75) Inventors: Tommaso Vali, Latina (IT); Giovanni Santin, Vazia (IT); Michele Incarnati, Gioia del Marsi (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/632,121

(22) Filed: Dec. 7, 2009

(65) Prior Publication Data

US 2010/0085807 A1 Apr. 8, 2010

Related U.S. Application Data

(63) Continuation of application No. 12/170,563, filed on Jul. 10, 2008, now Pat. No. 7,630,241, which is a continuation of application No. 11/506,428, filed on Aug. 18, 2006, now Pat. No. 7,417,894.

(30) Foreign Application Priority Data

Feb. 15, 2006 (IT) .............................. RM2006A0074

(51) Int. Cl.
*G11C 11/34* (2006.01)
(52) U.S. Cl. ............................... 365/185.03; 365/185.24
(58) Field of Classification Search ............. 365/185.03, 365/185.24
See application file for complete search history.

(56) References Cited

U.S. PATENT DOCUMENTS

| | | | |
|---|---|---|---|
| 5,566,105 A | 10/1996 | Tanaka et al. |
| 5,570,315 A | 10/1996 | Tanaka et al. |
| 5,835,414 A | 11/1998 | Hung et al. |
| 6,141,244 A | 10/2000 | Pawletko et al. |
| 6,288,936 B1 | 9/2001 | Kawamura |
| 6,556,479 B2 | 4/2003 | Makuta et al. |
| 6,556,499 B2 | 4/2003 | Sato et al. |
| 6,735,116 B2 | 5/2004 | Lee et al. |
| 6,826,082 B2 | 11/2004 | Hwang et al. |
| 6,944,045 B2 | 9/2005 | Fujimori |
| 6,947,323 B2 | 9/2005 | Naso et al. |
| 6,985,778 B2 | 1/2006 | Kim et al. |
| 7,031,192 B1 | 4/2006 | Park et al. |
| 7,035,144 B2 | 4/2006 | Kim et al. |
| 7,145,799 B2 | 12/2006 | Naso et al. |

(Continued)

FOREIGN PATENT DOCUMENTS

EP 1598831 11/2005

(Continued)

*Primary Examiner* — Michael T Tran
(74) *Attorney, Agent, or Firm* — Leffert Jay & Polglaze, P.A.

(57) ABSTRACT

A single latch circuit is coupled to each bit line in a multiple level cell memory device to handle reading multiple data bits. The circuit is comprised of a latch having an inverted node and a non-inverted node. A first control transistor selectively couples the non-inverted node to a latch output. A second control transistor selectively couples the inverted node to the latch output. A reset transistor is coupled between the inverted node and circuit ground to selectively ground the circuit when the transistor is turned on.

21 Claims, 8 Drawing Sheets

U.S. PATENT DOCUMENTS

| | | |
|---|---|---|
| 7,180,803 B2 | 2/2007 | Santin |
| 7,187,584 B2 | 3/2007 | Chang |
| 7,254,071 B2 | 8/2007 | Tu et al. |
| 7,274,614 B2 | 9/2007 | Bang et al. |
| 7,289,360 B2 | 10/2007 | Guterman et al. |
| 2004/0151026 A1 | 8/2004 | Naso et al. |
| 2005/0018488 A1 | 1/2005 | Kim et al. |
| 2005/0213378 A1 | 9/2005 | Chang |
| 2005/0232011 A1 | 10/2005 | Lee et al. |
| 2005/0237804 A1 | 10/2005 | Naso et al. |
| 2006/0083063 A1 | 4/2006 | Lee et al. |
| 2006/0171205 A1 | 8/2006 | Bang et al. |
| 2006/0187710 A1 | 8/2006 | Son |
| 2006/0198188 A1* | 9/2006 | Ju ............... 365/185.12 |
| 2006/0221714 A1* | 10/2006 | Li et al. ............ 365/189.01 |
| 2008/0175063 A1 | 7/2008 | Son et al. |

FOREIGN PATENT DOCUMENTS

| | | |
|---|---|---|
| WO | WO 2005/069150 | 7/2005 |
| WO | WO 2005/106892 | 11/2005 |

* cited by examiner

US 8,004,892 B2

SINGLE LATCH DATA CIRCUIT IN A MULTIPLE LEVEL CELL NON-VOLATILE MEMORY DEVICE

RELATED APPLICATIONS

This application is a Continuation of Ser. No. 12/170,563 titled "SINGLE LATCH DATA CIRCUIT IN A MULTIPLE LEVEL CELL NON-VOLATILE MEMORY DEVICE," filed Jul. 10, 2008 now U.S. Pat. No. 7,630,241 which is a Continuation of U.S. application Ser. No. 11/506,428, filed Aug. 18, 2006, now U.S. Pat. No. 7,417,894 issued on Aug. 26, 2008 the contents of which are incorporated by reference herein in their entirety, which claims the benefit of the priority date of Italian Patent Application Serial No. RM2006A000074, entitled "SINGLE LATCH DATA CIRCUIT IN A MULTIPLE LEVEL CELL NON-VOLATILE MEMORY DEVICE", filed Feb. 15, 2006.

TECHNICAL FIELD

The present invention relates generally to memory devices and in particular the present invention relates to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit.

Memory density can be increased by using multiple level cells (MLC). MLC memory can increase the amount of data stored in an integrated circuit without adding additional cells and/or increasing the size of the die. The MLC method stores two or more data bits in each memory cell.

A multilevel cell has multiple $V_t$ windows that each indicate a different state as shown in FIG. 1. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage ranges of 200 mV for each range. Typically, a dead space or margin of 0.2V to 0.4V is between each range. If the threshold voltage of the cell is within the first range, the cell is storing a 11. If the threshold voltage is within the second range, the cell is storing a 10. This continues for as many ranges that are used for the cell. MLC requires tight control of the threshold voltages in order to use multiple threshold levels per cell.

One critical parameter of MLC flash memory integrated circuits is the transistor count of the sense amplifier that is used to read the programmed values in the cells. The high parallelism of flash memory devices requires that the same sense amplifier data latch be used at least one for each bit line being read out of the array. This problem is worse for MLC devices since the circuits need to handle two bits from each bit line. This greatly increases the number of transistors required for read-modify-write operations.

Due to intense competition and consumer desire for longer battery life in electronic devices, manufacturers must constantly find ways to reduce the quantity of components in devices while maintaining reliability. For the reasons stated above, and for other reasons stated below that will become apparent to those skilled in the art upon reading and understanding the present specification, there is a need in the art for reducing the quantity of transistors required in sense amplifier data latches in MLC memory devices.

DETAILED DESCRIPTION

Figure 1:
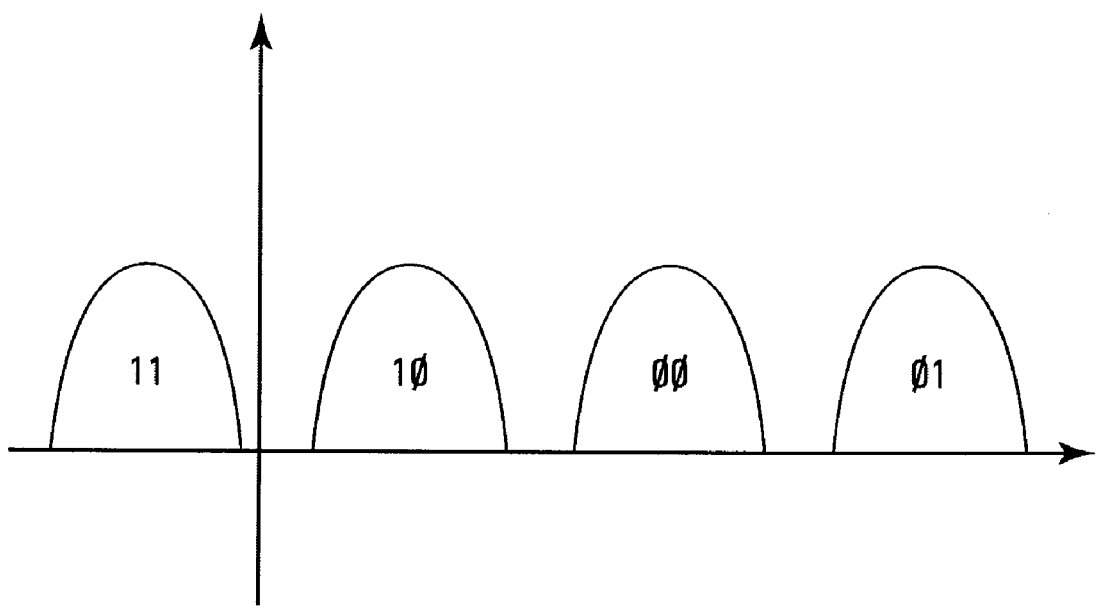
FIG. 1 shows a diagram of the threshold voltage distributions of a multiple level cell memory.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
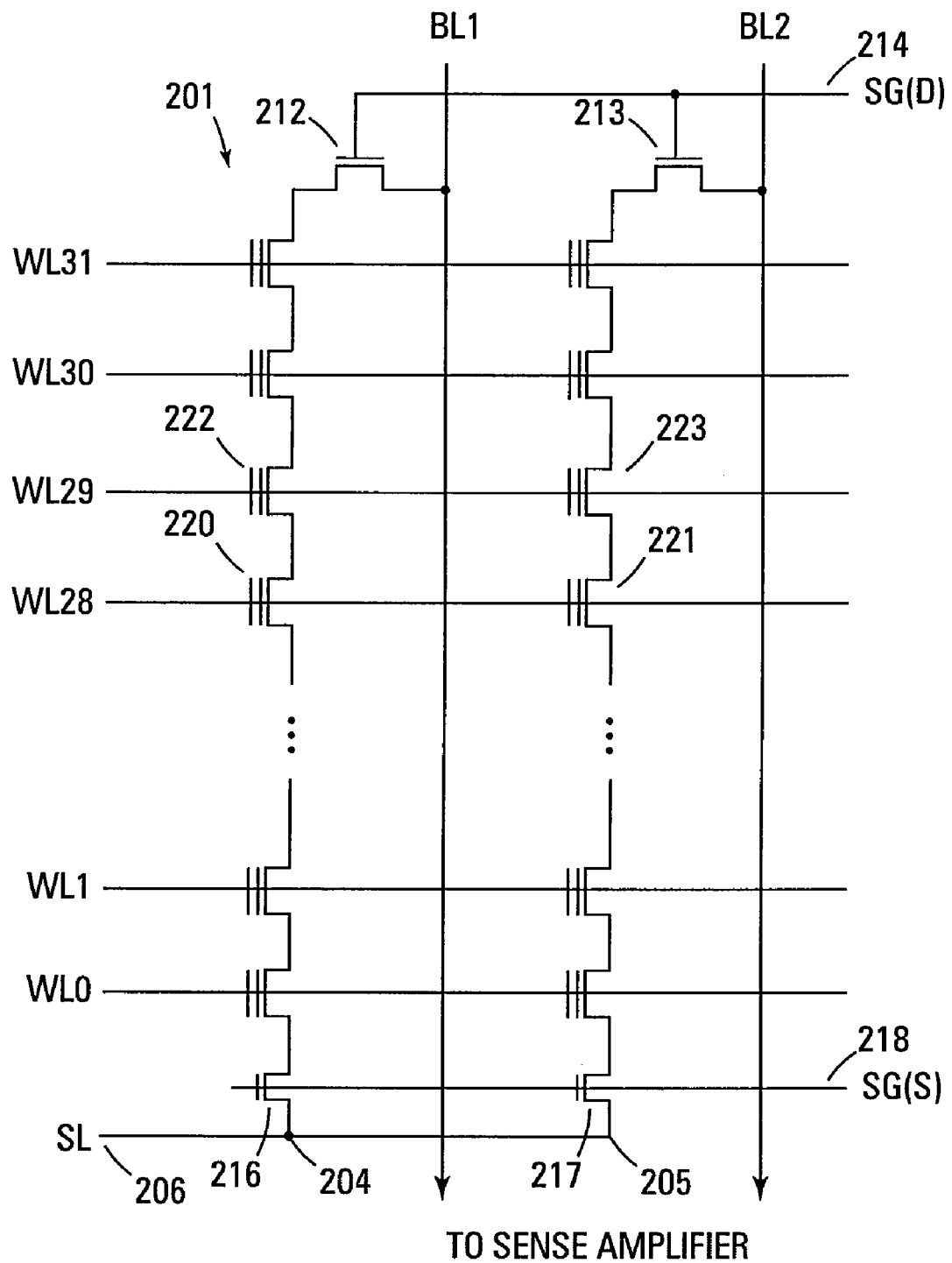
FIG. 2 shows a simplified diagram of one embodiment of a NAND flash memory array.

FIG. 2 illustrates a simplified diagram of one embodiment for a semiconductor NAND flash memory array of the present invention. This memory array is for purposes of illustration only as the present invention is not limited any one non-volatile memory technology or architecture.

The memory array of FIG. 2, for purposes of clarity, does not show all of the elements typically required in a memory array. For example, only two bit lines are shown (BL1 and BL2) when the number of bit lines required actually depends upon the memory density and chip architecture. The bit lines are subsequently referred to as (BL1-BLN). The bit lines (BL1-BLN) are eventually coupled to sense amplifiers (not shown) that detect the state of each cell.

The array is comprised of an array of floating gate cells 201 arranged in series strings 204, 205. Each of the floating gate cells 201 are coupled drain to source in each series chain 204, 205. A word line (WL0-WL31) that spans across multiple series strings 204, 205 is coupled to the control gates of every floating gate cell in a row in order to control their operation. In one embodiment, an array is comprised of 32 word lines. However, the present invention is not limited to any one word line quantity.

In operation, the word lines (WL0-WL31) select the individual floating gate memory cells in the series chain 204, 205 to be written to or read from and operate the remaining floating gate memory cells in each series string 204, 205 in a pass through mode. Each series string 204, 205 of floating gate memory cells is coupled to a source line 206 by a source select gate 216, 217 and to an individual bit line (BL1-BLN) by a drain select gate 212, 213. The source select gates 216, 217 are controlled by a source select gate control line SG(S) 218 coupled to their control gates. The drain select gates 212, 213 are controlled by a drain select gate control line SG(D) 214.

In the embodiment of FIG. 2, WL0 is at the bottom of the page and WL31 is at the top of the page. However, these labels are for purposes of illustration only as WL0 can also begin at the top of the page with the word line numbers increasing towards the bottom of the page.

Each cell can be programmed as a single bit per cell (i.e., single level cell—SLC) or multiple bits per cell (i.e., multiple level cell—MLC). Each cell's threshold voltage ($V_t$) determines the data that is stored in the cell. For example, in a single bit per cell, a $V_t$ of 0.5V might indicate a programmed cell (i.e., logical 0 state) while a $V_t$ of −0.5V might indicate an erased cell (i.e., logical 1 state). Multiple level cell operation has been discussed previously.

The embodiments of the present invention are not limited to two bits per cell. Some embodiments may store more than two bits per cell, depending on the quantity of different voltage ranges that can be differentiated on the cell.

During a typical prior art programming operation, the selected word line for the flash memory cell to be programmed is biased with a series of programming pulses that start at a voltage (e.g., 20V) with each subsequent pulse voltage increasing incrementally until the cell is programmed or a maximum programming voltage is reached. Unselected word lines are biased at $V_{pass}$ (e.g., 10V). Selected bit lines are biased at 0V while unselected bit lines are biased $V_{CC}$ to inhibit the program operation for those series strings.

A verification (read) operation with a selected word line voltage of 0V is then performed to determine if the floating gate is at the proper voltage (e.g., 0.5V). In one embodiment, the unselected word line voltages can be any voltage equal to or greater than ground potential. The bit lines are precharged to $V_{CC}$ while the SG(D) and SG(S) are selected. Each of the memory cells is programmed/verified in a substantially similar fashion.

Figure 3:
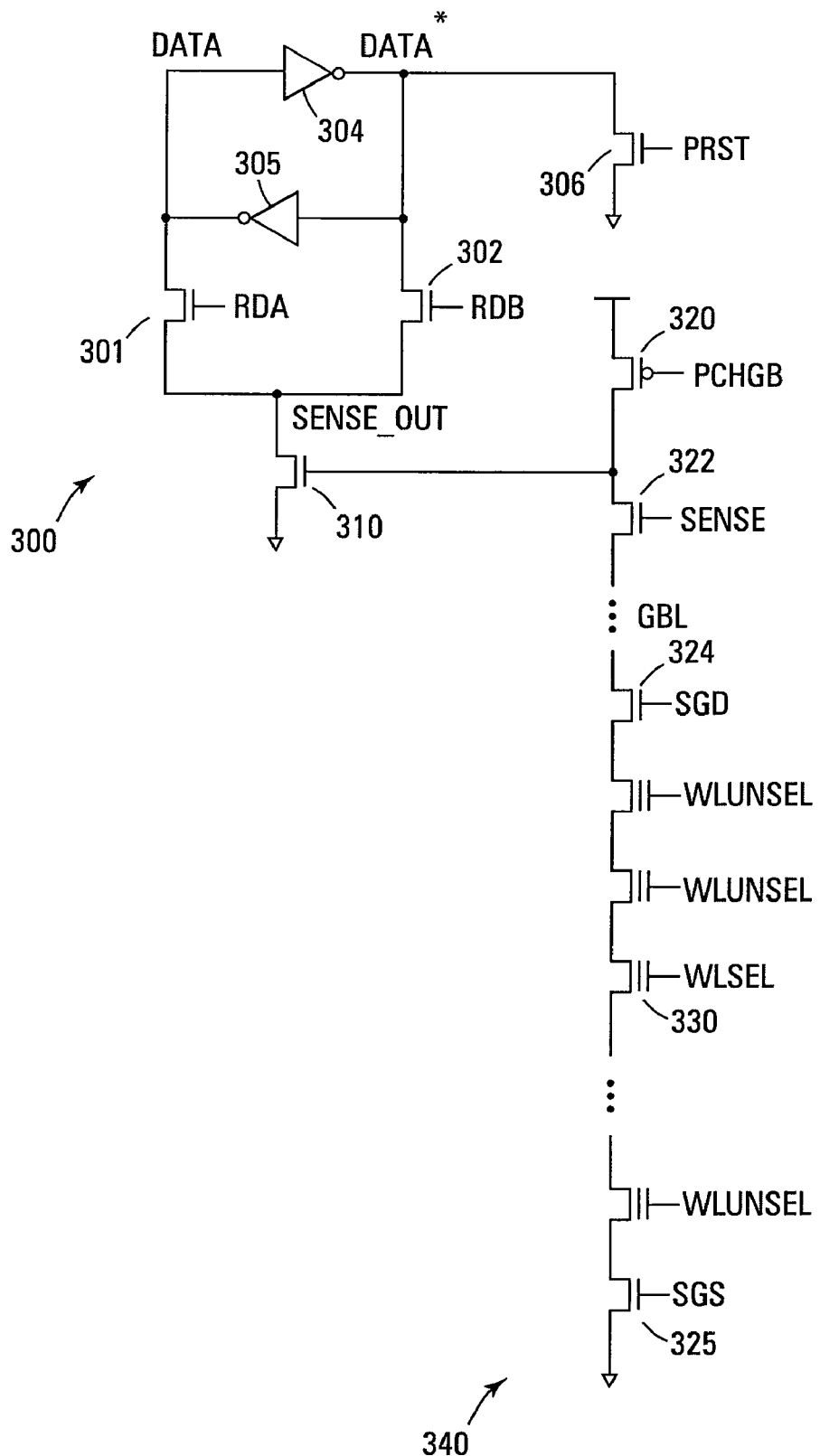
FIG. 3 shows a schematic diagram of one embodiment of a data latch of the present invention.

FIG. 3 illustrates a schematic diagram of a data latch circuit 300 of the present invention coupled to a portion of a series string of memory cells 340 of a NAND flash memory array.

The latch circuit 300 is comprised of two inverters 304, 305 that are coupled to a DATA node and a DATA* node that is the inverse of the DATA node. Three control transistors 301, 302, and 306 are coupled to the inverters 304, 305 to control the operation of the latch circuit 300. Two of the transistors 301, 302 control which side (i.e., DATA or DATA*) of the latch 304, 305, in response to active high RDA and RDB control signals, is coupled to the SENSE_OUT node. The other transistor 306 is a reset transistor that has an active high PRST signal coupled to the gate to control when the transistor is turned on to pull the DATA* output of the latch to ground.

The series string of memory cells 340, in one embodiment, is comprised of thirty-two floating gate flash memory cells as illustrated in FIG. 2. Each of the memory cells in unselected rows that are biased by the "WLUNSEL" voltage that is coupled to each of the "unselected" word lines. The selected word line is biased by the "WLSEL" voltage. Alternate embodiments can use other quantities of memory cells in each series string as well as different non-volatile memory cell technology.

The select gate source transistor 325 and the select gate drain transistor 324 are on opposing sides of the string 340. The series string 340 is then coupled to the global bit line GBL that is coupled to an NMOS control transistor 322 that controls access to the sense amplifier by the string 340. The gate of the control transistor 322 is biased by a "SENSE" voltage that controls operation of the transistor 322.

A precharge PMOS transistor 320 couples the NMOS control transistor 322 to $V_{CC}$ for precharging the bit line during a read operation. A logical low level on the gate of the PMOS transistor 320 turns the transistor on.

A sense amplifier output transistor 310 has its gate coupled between the NMOS transistor 322 and the PMOS transistor 320. A logical high on the gate of this transistor 310 pulls the latch circuit 300 to ground as will be described subsequently. A logical low on the gate causes the latch circuit 300 to see a high impedance state.

Operation of the latch circuit 300 of FIG. 3 is discussed with reference to the threshold voltage distributions illustrated in FIGS. 4 and 5. Each distribution, 401-404 of FIG. 4 and 501-504 of FIG. 5, represents a different MLC state. The MLC data stored in each cell represents two pages of data, page 1 and page 0 (i.e., P1-P0).

Figure 4:
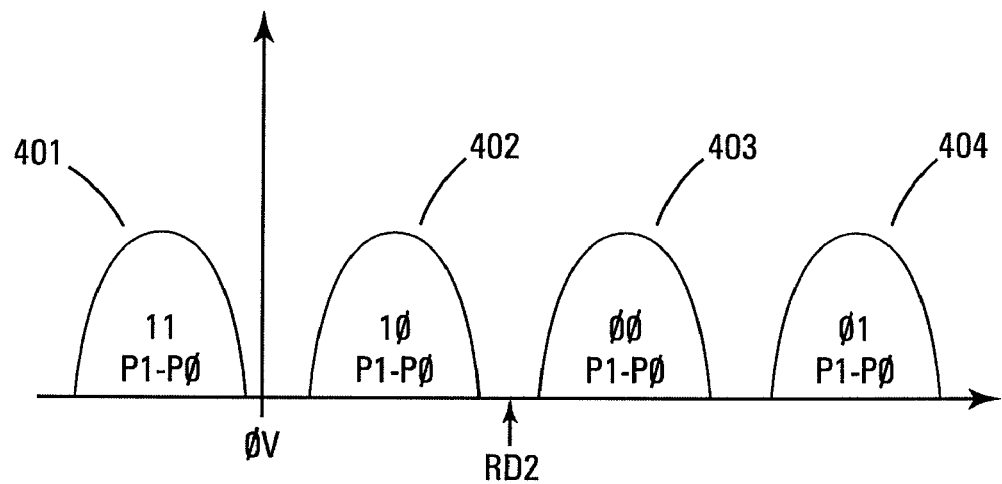
FIG. 4 shows a diagram of the threshold voltage distribution in accordance with a page one read operation of the present invention.
Figure 5:
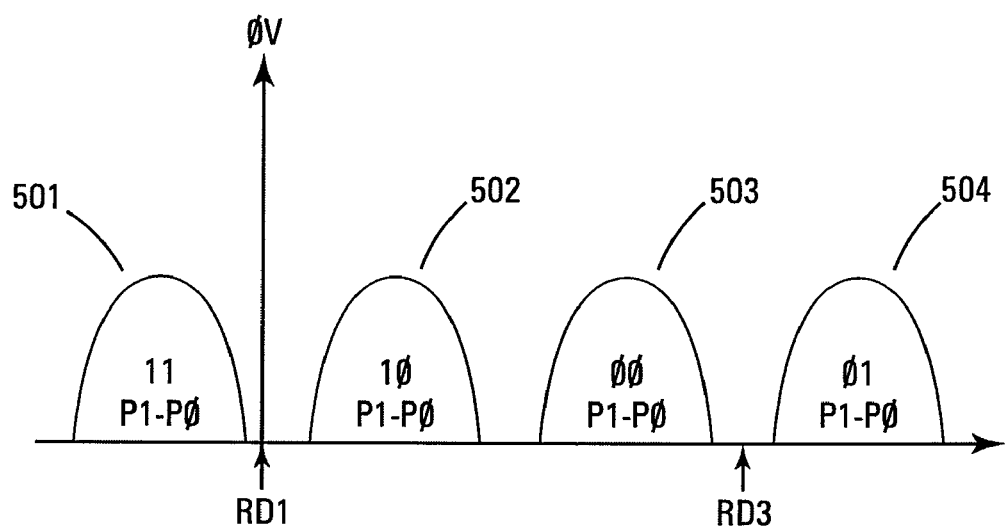
FIG. 5 shows a diagram of the threshold voltage distribution in accordance with a page zero read operation of the present invention.

FIG. 4 illustrates the threshold voltage distributions 401-404 for reading page 1 (P1) of the memory cells. The most negative state 401 is a logical "11" state. The next state 402 is the logical "10" state. The following state 403 is the logical "00" state. The most positive state 404 is the logical "01" state. The read voltage, RD2, that is applied to the selected word line as the "WLSEL" voltage is illustrated between the middle two states 402, 403.

FIG. 5 illustrates the threshold voltage distributions 501-504 for reading page 0 (P0) of the memory cells. The most negative state 501 is a logical "11" state. The next most positive state 502 is the logical "10" state. The following state 503 is a logical "00" state. The most positive state 504 is the logical "01" state. The read voltages, RD1 and RD3, are applied to the selected word line as the "WLSEL" voltage. The read 1 voltage (i.e., RD1) is between the first and second states 501, 502. The read 3 voltage (i.e., RD3) is between the last two states 503, 504.

Referring to FIGS. 3 and 4, the first state (i.e., logical 11) 401 is read by the following procedure. At a first time, $t_0$, the PRST signal is a logical 1 and RDA is a logical 0. This results in the latch circuit DATA* signal being a logical 0 and DATA is loaded with a logical 1.

At time $t_1$, the PRST signal is a logical 0 to turn off the transistor 306. The memory cell transistor 330 is coupled to the selected word line bias WLSEL that is now at the read voltage RD2 as illustrated in FIG. 4. The sense amplifier then performs a sense operation as is well known in the art. After the sense operation, RDA is a logical 1 to turn on its respective transistor 301 and RDB is kept at a logical 0 to keep the transistor 302 turned off, thus connecting the DATA node of the latch to the SENSE_OUT node that is now floating. This results in the logical 1 (i.e., DATA) of page1 of the first state 401 being read.

The second state (i.e., logical 10) 402 is read by the following procedure. At a first time, $t_0$, the PRST signal is a logical 1 and RDA is a logical 0. This results in the latch circuit DATA* signal being a logical 0 and DATA is loaded with a logical 1.

At time $t_1$, the PRST signal is a logical 0 to turn off the transistor 306. The memory cell transistor 330 is coupled to the selected word line bias WLSEL that is now at the read voltage RD2 as illustrated in FIG. 4. The sense amplifier then performs a sense operation as is well known in the art. After the sense operation, RDA is a logical 1 to turn on its respective transistor 301 and RDB is kept at a logical 0 to keep the transistor 302 turned off, thus connecting the DATA node of the latch to the SENSE_OUT node that is now floating. This results in the logical 1 (i.e., DATA) of page1 of the second state 402 being read.

The third state (i.e., logical 00) 403 is read by the following procedure. At a first time, $t_0$, the PRST signal is a logical 1 and RDA is a logical 0. This results in the latch circuit DATA* signal being a logical 0 and DATA is loaded with a logical 1.

At time $t_1$, the PRST signal is a logical 0 to turn off the transistor 306. The memory cell transistor 330 is coupled to the selected word line bias WLSEL that is now at the read voltage RD2 as illustrated in FIG. 4. The sense amplifier then performs a sense operation as is well known in the art. After the sense operation, RDA is a logical 1 to turn on its respective transistor 301 and RDB is kept at a logical 0 to keep the transistor 302 turned off, thus connecting the DATA node of the latch to the SENSE_OUT node that is now at a logical 0. This results in the logical 0 (i.e., DATA) of page1 of the third state 403 being read.

The fourth state (i.e., logical 01) 404 is read by the following procedure. At a first time, $t_0$, the PRST signal is a logical 1 and RDA is a logical 0. This results in the latch circuit DATA* signal being a logical 0 and DATA is loaded with a logical 1.

At time $t_1$, the PRST signal is a logical 0 to turn off the transistor 306. The memory cell transistor 330 is coupled to the selected word line bias WLSEL that is now at the read voltage RD2 as illustrated in FIG. 4. The sense amplifier then performs a sense operation as is well known in the art. After the sense operation, RDA is a logical 1 to turn on its respective transistor 301 and RDB is kept at a logical 0 to keep the transistor 302 turned off, thus connecting the DATA node of the latch to the SENSE_OUT node that is now at a logical 0. This results in the logical 0 (i.e., DATA) of page1 of the fourth state 404 being read.

Referring to FIGS. 3 and 5, the first state 501 of page 0 (i.e., P0) is read by the following procedure. At a first time, $t_0$, the PRST signal is a logical 1 and RDA is a logical 0. This results in the latch circuit DATA* signal being a logical 0 and DATA is loaded with a logical 1.

At time $t_1$, the PRST signal is a logical 0 to turn off the transistor 306. The memory cell transistor 330 is coupled to the selected word line bias WLSEL that is now at the read voltage RD1 as illustrated in FIG. 5. The sense amplifier then performs a sense operation as is well known in the art. After the sense operation, RDA is a logical 1 to turn on its respective transistor 301 and RDB is kept at a logical 0 to keep the transistor 302 turned off thus connecting the DATA node of the latch to the SENSE_OUT node that is now floating. This results in the node DATA being a logic 1.

At time $t_2$, the PRST signal is a logical 0 to turn off the transistor 306. The memory cell transistor 330 is coupled to the selected word line bias WLSEL that is now at the read voltage RD3 as illustrated in FIG. 5. The sense amplifier then performs a sense operation as is well known in the art. After the sense operation, RDA is a logical 0, RDB is a logical 1 to turn on its respective transistor 302 thus connecting the DATA* node of the latch formed by the inverters 304, 305 to the SENSE_OUT node that is now floating. This results in the logical 1 (i.e., DATA) of page 0 of the first state 501 being read.

The second state (i.e., logical 10) 502 is read by the following procedure. At a first time, $t_0$, the PRST signal is a logical 1 and RDA is a logical 0. This results in the latch circuit DATA* signal being a logical 0 and DATA is loaded with a logical 1.

At time $t_1$, the PRST signal is a logical 0 to turn off the transistor 306. The memory cell transistor 330 is coupled to the selected word line bias WLSEL that is now at the read voltage RD1 as illustrated in FIG. 5. The sense amplifier then performs a sense operation as is well known in the art. After the sense operation, RDA is a logical 1 to turn on its respective transistor 301 and RDB is kept at a logical 0 to keep the transistor 302 turned off thus connecting the DATA node of the latch to the SENSE_OUT node that is now a logical 0. This results in the node DATA being a logic 0.

At time $t_2$, the PRST signal is a logical 0 to turn off the transistor 306. The memory cell transistor 330 is coupled to the selected word line bias WLSEL that is now at the read voltage RD3 as illustrated in FIG. 5. The sense amplifier then performs a sense operation as is well known in the art. After the sense operation, RDA is a logical 0, RDB is a logical 1 to turn on its respective transistor 302 thus connecting the DATA* node of the latch formed by the inverters 304, 305 to the SENSE_OUT node that is now floating. This results in the logical 0 (i.e., DATA) of page 0 of the second state 502 being read.

The third state (i.e., logical 00) 503 is read by the following procedure. At a first time, $t_0$, the PRST signal is a logical 1 and RDA is a logical 0. This results in the latch circuit DATA* signal being a logical 0 and DATA is loaded with a logical 1.

At time $t_1$, the PRST signal is a logical 0 to turn off the transistor 306. The memory cell transistor 330 is coupled to the selected word line bias WLSEL that is now at the read voltage RD1 as illustrated in FIG. 5. The sense amplifier then performs a sense operation as is well known in the art. After the sense operation, RDA is a logical 1 to turn on its respective transistor 301 and RDB is kept at a logical 0 to keep the transistor 302 turned off thus connecting the DATA node of the latch to the SENSE_OUT node that is now at a logical 0. This results in the node DATA being a logic 0.

At time $t_2$, the PRST signal is a logical 0 to turn off the transistor 306. The memory cell transistor 330 is coupled to the selected word line bias WLSEL that is now at the read voltage RD3 as illustrated in FIG. 5. The sense amplifier then performs a sense operation as is well known in the art. After the sense operation, RDA is a logical 0, RDB is a logical 1 to turn on its respective transistor 302 thus connecting the DATA* node of the latch formed by the inverters 304, 305 to the SENSE_OUT node that is now floating. This results in the logical 0 (i.e., DATA) of page 0 of the third state 503 being read.

The fourth state (i.e., logical 01) 504 is read by the following procedure. At a first time, $t_0$, the PRST signal is a logical 1 and RDA is a logical 0. This results in the latch circuit DATA* signal being a logical 0 and DATA is loaded with a logical 1.

At time $t_1$, the PRST signal is a logical 0 to turn off the transistor 306. The memory cell transistor 330 is coupled to the selected word line bias WLSEL that is now at the read voltage RD1 as illustrated in FIG. 5. The sense amplifier then performs a sense operation as is well known in the art. After the sense operation, RDA is a logical 1 to turn on its respective transistor 301 and RDB is kept at a logical 0 to keep the transistor 302 turned off thus connecting the DATA node of the latch to the SENSE_OUT node that is now at a logical 0. This results in the node DATA being a logic 0.

At time $t_2$, the PRST signal is a logical 0 to turn off the transistor 306. The memory cell transistor 330 is coupled to the selected word line bias WLSEL that is now at the read voltage RD3 as illustrated in FIG. 5. The sense amplifier then performs a sense operation as is well known in the art. After the sense operation, RDA is a logical 0, RDB is a logical 1 to turn on its respective transistor 302 thus connecting the DATA* node of the latch formed by the inverters 304, 305 to the SENSE_OUT node that is now at a logical 0. This results in the logical 1 (i.e., DATA) of page 0 of the fourth state 504 being read.

Figure 6:
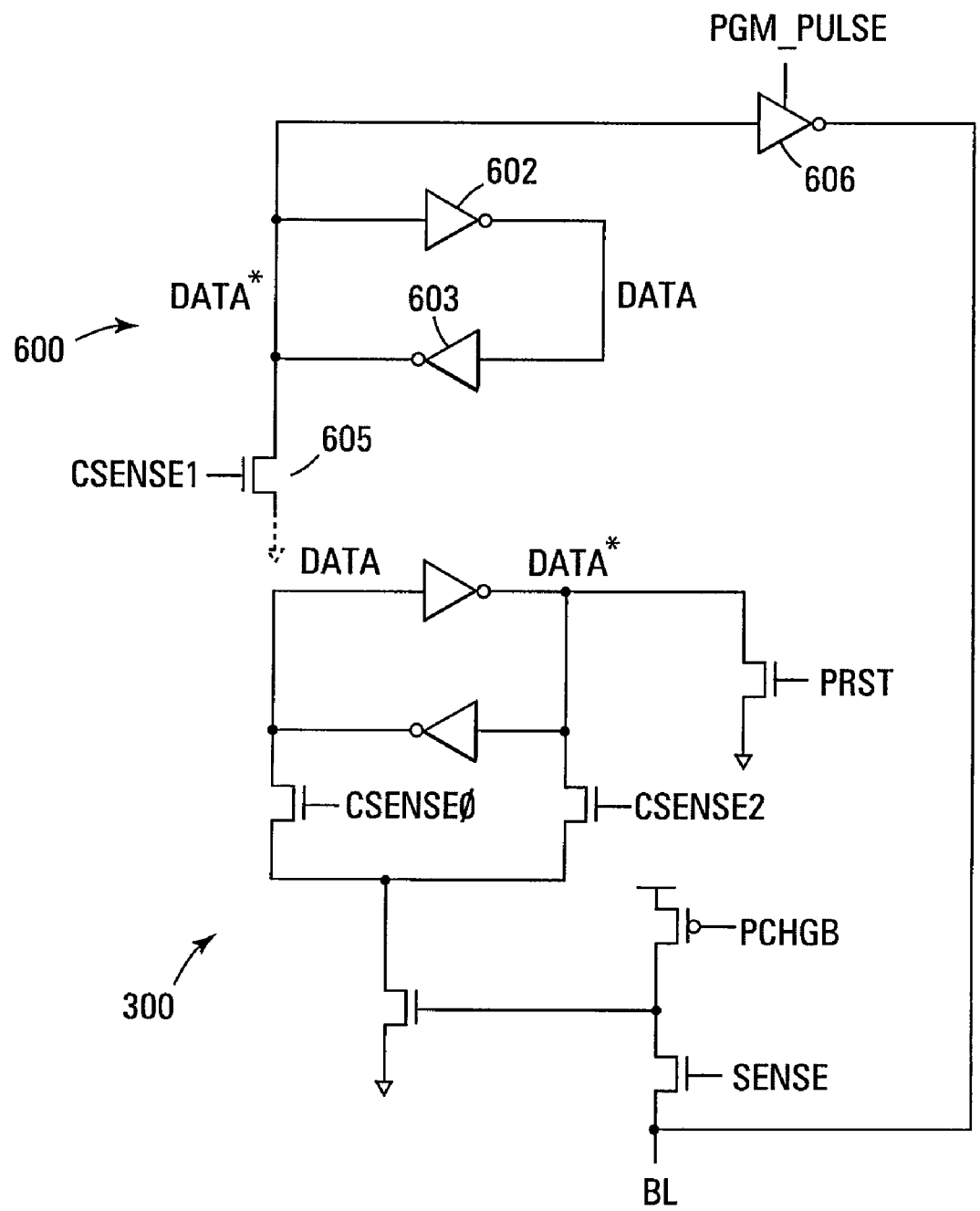
FIG. 6 shows a schematic diagram of one embodiment of two data latches in accordance with the programming operation of the present invention.

A read-modify-write technique is used to generate the inhibit voltage of the program operation of a NAND cell when its $V_t$ pass the verify level. One embodiment for a circuit to accomplish this is illustrated in FIG. 6.

The circuit is comprised of a latch 600, made up of two inverters 602, 603, with a control transistor 605. The gate of the transistor 605 is connected to "CSENSE1" control signal that goes high when a cell has been verified as programmed during a verify operation. The drain of the transistor 605 is shown coupled to a circuit ground in dotted lines. The dotted lines represent the functional equivalent of the circuit to which the transistor 605 is coupled as illustrated subsequently with reference to FIG. 7.

The read-modify-write technique involves storing the data to be programmed in the latch 600 as DATA during the program pulse and then modify it when the $V_t$ of the cell has become higher than a predetermined verify value. In other words, the cell has been successfully programmed. For example, assuming that DATA to be programmed is a logical 0 and while the "CSENSE1" signal is low, the transistor 605 is turned off and the latch output through the inverter gate 606 is a logical "0". The inverter gate 606 is enabled whenever the program pulse (i.e., pgm_pulse) goes high. During this time, the logical low signal is applied to the bit line thus allowing the cells on the selected word line to be programmed.

When CSENSE1 goes high after the verify operation has passed, DATA* is pulled to a logical 0 through the transistor 605 and the output of the inverter gate 606 is a logical high. This $V_{CC}$ bias is applied to the bit line, thereby inhibiting the program operation.

Figure 7:
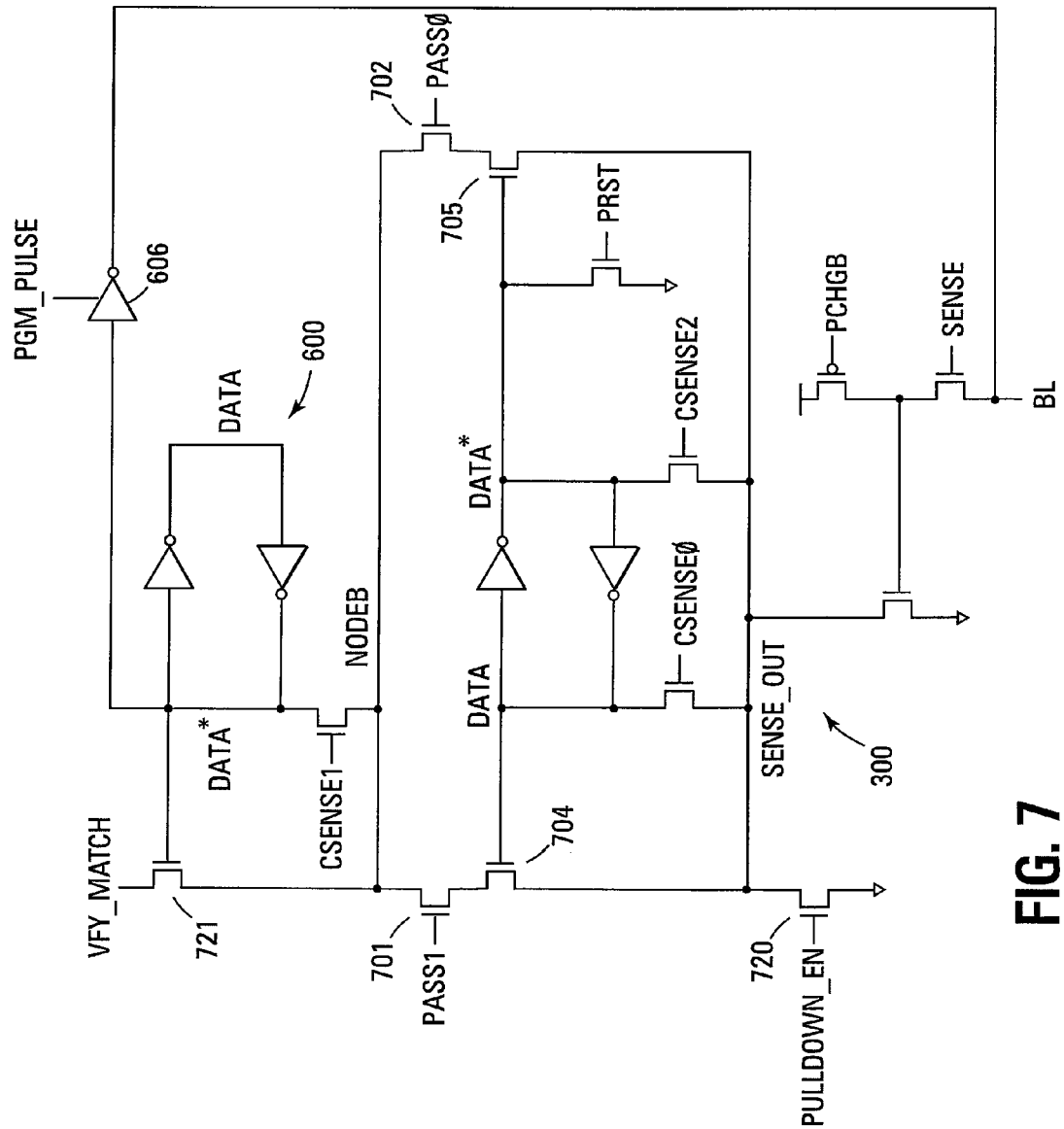
FIG. 7 shows a schematic diagram of the data latches and support circuitry of the present invention.

FIG. 7 illustrates the data latches and support circuitry of the present invention. This circuit includes the first data latch circuit 300 as illustrated in FIG. 3 and the second data latch circuit 600 as illustrated in FIG. 6. The pass transistors 701, 702 and support circuitry 704, 705 that ties the latches 300, 600 together is also shown. A pull-up transistor 721 is coupled to a VFY_MATCH signal that is a logic high when the programmed data has been verified. A pull-down transistor 720 is coupled to the first latch circuit 300 with a "PULLDOWN_EN" signal coupled to the gate that goes high to turn on the transistor 720.

After the read-modify-write operation described previously, VFY_MATCH is precharged or pulled up to a logical 1 level. Then if all the bits to be programmed are modified from 0 to 1, the node DATA* will be at a logical 0 and the common line VFY_MATCH will stay at a logical 1. If some of the bits to be programmed are still at a logical 0 after the read-modify-write operation, the information regarding the bits failing to verify can be extracted.

To extract the bit information, PASS1 is set high, PASS0 is set low, and PULLDOWN_EN is set to a high state. The VFY_MATCH line is pulled down if any of page 0 (P0) die not pass the verify operation during a P0 programming.

By making PASS1=0, PASS0=1, and PULLDOWN_EN=1, the VFY_MATCH line will be pulled down if any of P1, having P0=0, did not pass the verify operation. By making PASS1=1, PASS0=1, and PULLDOWN_EN=1, the VFY_MATCH line is pulled down if any of the data to be programmed did not pass the verify operation.

To verify the programming of P0, the first latch circuit 300 is preset so that DATA node is a logical 1. P0=0 is loaded into the second latch circuit 600 at node DATA. A verify voltage, VFY1 is applied to WLSEL and PASS1=1. In one embodiment, the VFY1 voltage is located between the first two MLC states. A sense operation is then performed by the sense amplifier as is well known in the art. After the sense operation, CSENSE1=1.

If the threshold voltage sensed is greater than or equal to VFY1, SENSE_OUT=0, NODEB=0, and P0 becomes a logical 1. The programming is inhibited as explained previously for the next programming pulse.

If the threshold voltage sensed is less than VFY1, SENSE_OUT is in a high impedance state and P0 stays a logical low. The programming operation is then performed again.

To verify the programming of P1 with VFY3 voltage when P0=1, P0 is read and stored in the first latch 300 at the DATA node during the beginning of the programming operation. P1=0 is loaded into the second latch 600 at the DATA node. A verify voltage, VFY3 is used to bias the selected word line as WLSEL. VFY3, in one embodiment, is a voltage located between the third and fourth MLC states. VFY2, in one embodiment, is a voltage located between the second and third MLC states.

The gates of the pass transistors 701, 702 are biased as PASS1=1 and PASS0=0. A sense operation is then performed. After the sense amplifier has accomplished the sense operation, CSENSE1=1. If the threshold voltage, $V_t$, is greater than or equal to VFY3, the SENSE_OUT node=0 and NODEB=0. P0 becomes a logical 1 and the programming operation is inhibited for the next programming pulse only for cells having P0=1. If $V_t$ is less than VFY3, the SENSE_OUT node is high impedance and P0 stays as a logical 0. The programming operation is performed again.

To verify the programming of P1 with VFY2 when P0=0, P0 is read and loaded into the first latch circuit at the DATA node during the beginning of the programming operation. The DATA node of the second latch 600 is loaded with P1=0. A verify voltage, VFY2, biases the selected word line as the WLSEL voltage. PASS0=1 and PASS1=0. A sense operation is then performed by the sense amplifier. After the sense operation, CSENSE1=1.

If the sensed threshold voltage, Vt, is greater than or equal to VFY3, the SENSE_OUT node is a logical 0, NODEB=0, and P0 becomes a logical 1. The next programming operation is inhibited only for cells having P1=0.

If the sensed threshold is less than VFY3, the SENSE_OUT node is in a high impedance state. In this case, P0 stays as a logical 0 and the programming operation is performed again.

Figure 8:
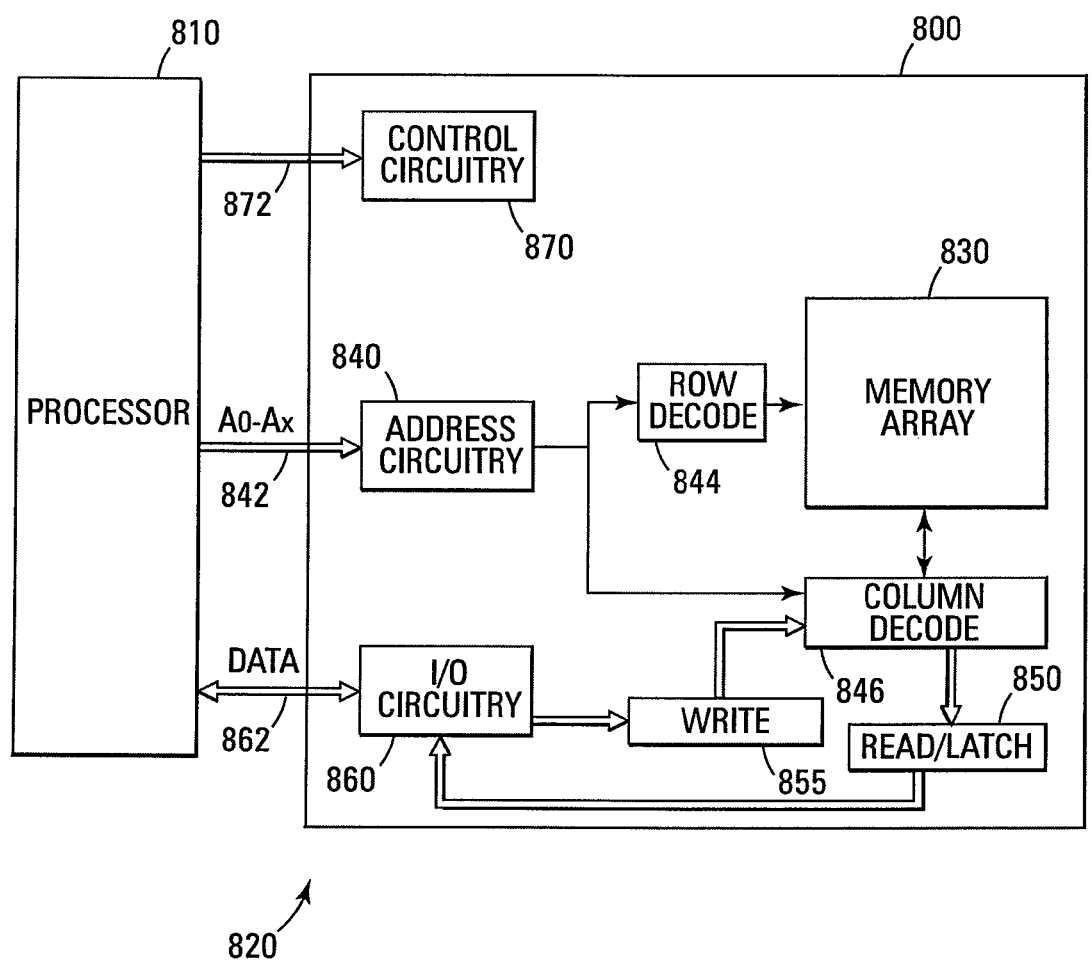
FIG. 8 shows a block diagram of one embodiment of a memory system of the present invention.

FIG. 8 illustrates a functional block diagram of a memory device 800 that can incorporate the flash memory array and programming method embodiments of the present invention. The memory device 800 is coupled to a processor 810 that is responsible for executing the software driver of the present invention for writing SLC data into an MLC device. The processor 810 may be a microprocessor or some other type of controlling circuitry. The memory device 800 and the processor 810 form part of a memory system 820. The memory device 800 has been simplified to focus on features of the memory that are helpful in understanding the present invention.

The memory device includes an array of flash memory cells 830 as described above with reference to FIG. 8. The memory array 830 is arranged in banks of rows and columns. The control gates of each row of memory cells is coupled with a word line while the drain and source connections of the memory cells are coupled to bitlines. As is well known in the art, the connections of the cells to the bitlines determines whether the array is a NAND architecture, an AND architecture, or a NOR architecture.

An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense/buffer circuitry 850. The sense/buffer circuitry, in one embodiment, is coupled to read and latch a row of data from the memory array 830. Data input and output buffer circuitry 860 is included for bi-directional data communication over a plurality of data connections 862 with the controller 810. Write circuitry 855 is provided to write data to the memory array.

Control circuitry 870 decodes signals provided on control connections 872 from the processor 810. These signals are used to control the operations on the memory array 830, including data read, data write (program), and erase operations. The control circuitry 870 may be a state machine, a sequencer, or some other type of controller.

The flash memory device illustrated in FIG. 8 has been simplified to facilitate a basic understanding of the features of the memory. A more detailed understanding of internal circuitry and functions of flash memories are known to those skilled in the art.

Figure 9:
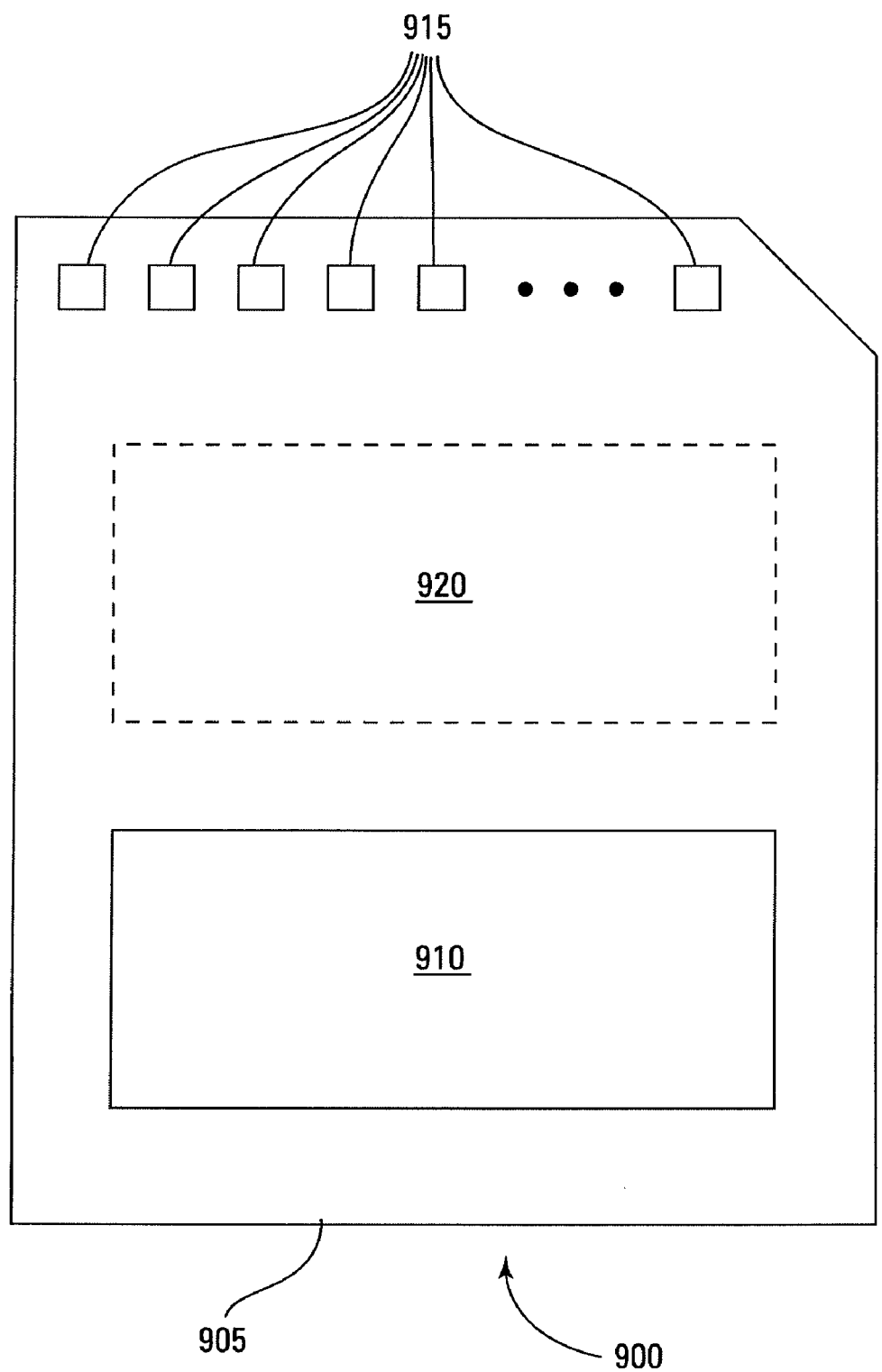
FIG. 9 shows a block diagram of one embodiment of a memory module of the present invention.

FIG. 9 is an illustration of an exemplary memory module 900. Memory module 900 is illustrated as a memory card, although the concepts discussed with reference to memory module 900 are applicable to other types of removable or portable memory, e.g., USB flash drives, and are intended to be within the scope of "memory module" as used herein. In addition, although one example form factor is depicted in FIG. 9, these concepts are applicable to other form factors as well.

In some embodiments, memory module 900 will include a housing 905 (as depicted) to enclose one or more memory devices 910, though such a housing is not essential to all devices or device applications. At least one memory device 910 is a non-volatile memory [including or adapted to perform elements of the invention]. Where present, the housing 905 includes one or more contacts 915 for communication with a host device. Examples of host devices include digital cameras, digital recording and playback devices, PDAs, personal computers, memory card readers, interface hubs and the like. For some embodiments, the contacts 915 are in the form of a standardized interface. For example, with a USB flash drive, the contacts 915 might be in the form of a USB Type-A male connector. For some embodiments, the contacts 915 are in the form of a semi-proprietary interface, such as might be found on COMPACTFLASH memory cards licensed by SANDISK Corporation, MEMORYSTICK memory cards licensed by SONY Corporation, SD SECURE DIGITAL memory cards licensed by TOSHIBA Corporation and the like. In general, however, contacts 915 provide an interface for passing control, address and/or data signals between the memory module 900 and a host having compatible receptors for the contacts 915.

The memory module 900 may optionally include additional circuitry 920 which may be one or more integrated circuits and/or discrete components. For some embodiments, the additional circuitry 920 may include a memory controller for controlling access across multiple memory devices 910 and/or for providing a translation layer between an external host and a memory device 910. For example, there may not be a one-to-one correspondence between the number of contacts 915 and a number of I/O connections to the one or more memory devices 910. Thus, a memory controller could selectively couple an I/O connection (not shown in FIG. 9) of a memory device 910 to receive the appropriate signal at the appropriate I/O connection at the appropriate time or to provide the appropriate signal at the appropriate contact 915 at the appropriate time. Similarly, the communication protocol between a host and the memory module 900 may be different than what is required for access of a memory device 910. A memory controller could then translate the command sequences received from a host into the appropriate command sequences to achieve the desired access to the memory device 910. Such translation may further include changes in signal voltage levels in addition to command sequences.

The additional circuitry 920 may further include functionality unrelated to control of a memory device 910 such as logic functions as might be performed by an ASIC (application specific integrated circuit). Also, the additional circuitry 920 may include circuitry to restrict read or write access to the memory module 900, such as password protection, biometrics or the like. The additional circuitry 920 may include circuitry to indicate a status of the memory module 900. For example, the additional circuitry 920 may include functionality to determine whether power is being supplied to the memory module 900 and whether the memory module 900 is currently being accessed, and to display an indication of its status, such as a solid light while powered and a flashing light while being accessed. The additional circuitry 920 may further include passive devices, such as decoupling capacitors to help regulate power requirements within the memory module 900.

CONCLUSION

In summary, the embodiments of the present invention handle two bits from an MLC memory device with only a single latch. Only one additional latch is used to implement MLC programming with a read-modify-write and verify during a programming operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for reading a multiple level memory cell operably coupled to a latch, the method comprising:
   resetting the latch at a first time, the latch having an inverted node, a non-inverted node, and a sense node;
   biasing a selected memory cell with a first read voltage and coupling the non-inverted node to the sense node at a second time to read a first page of data;
   resetting the latch at a third time;
   biasing the selected memory cell with a second read voltage and coupling the non-inverted node to the sense node at a fourth time; and
   biasing the selected memory cell with a third read voltage and coupling the inverted node to the sense node at a fifth time to read a second page of data.

2. The method of claim 1, wherein the first read voltage is greater than the second read voltage, and wherein the third read voltage is greater than the first read voltage.

3. The method of claim 1, wherein the first page of data comprises page 1 of the memory cell.

4. The method of claim 1, wherein the second page of data comprises page 0 of the memory cell.

5. The method of claim 1, wherein the third time is after the first time and the second time.

6. The method of claim 1, wherein resetting the latch comprises turning on a transistor that selectively grounds the latch.

7. A method for read-modify-write of a multiple level memory cell coupled to a latch, the method comprising:
  storing data, to be programmed to the memory cell, in the latch;
  selectively outputting the data to be programmed through an inverter that is enabled by a programming pulse wherein the data to be programmed selectively inhibits programming of the memory cell in response to a state of the data; and
  modifying the data after successful programming of the memory cell wherein modifying the data comprises:
    turning on a reset transistor to pull an inverted portion of the latch to a first logical state and an output of the inverter to an inverse logical state from the first logical state; and
    applying the output of the inverter to the memory cell to inhibit programming of the memory cell.

8. The method of claim 7 wherein a reset transistor coupled to the latch is turned off during the programming pulse.

9. The method of claim 7 wherein the output of the inverter is coupled to a bit line of the memory cell and enables or inhibits programming of the memory cell in response to the state of the data.

10. The method of claim 9 and further including if the state of the data is a logical low, enabling the memory cell to be programmed.

11. The method of claim 7 wherein modifying the data comprises verifying that a threshold voltage of the memory cell is higher than a verify value.

12. The method of claim 7 wherein the output of the inverter is applied to a drain of the memory cell to inhibit programming.

13. A method for reading a multiple level memory cell having first and second pages and being coupled to a circuit having first and second latches coupled together through first and second pass transistors, the method comprising:
  loading a first logical state into the first latch;
  loading a second logical state, inverse to the first logical state, into the second latch;
  enabling the first pass transistor;
  disabling the second pass transistor;
  applying a first verify voltage to the memory cell to verify programming of the first page;
  sensing a threshold voltage of the memory cell; and
  if the threshold voltage is greater than or equal to the first verify voltage, inhibiting further programming of the memory cell.

14. The method of claim 13 wherein the method for reading is performed when the memory cell has not been successfully programmed.

15. The method of claim 13 and further including verifying programming of the second page with a second verify voltage, the method comprising:
  reading the first page of data;
  loading the first latch with the first page of data;
  loading a logical low into the second latch;
  applying the second verify voltage to the memory cell where the second verify voltage is greater than the first verify voltage;
  sensing the threshold voltage of the memory cell; and
  if the threshold voltage is greater than or equal to the second verify voltage, inhibiting further programming of the memory cell.

16. The method of claim 15 and further including verifying programming of the second page with a third verify voltage, the method comprising:
  reading the first page of data;
  loading the first latch with the first page of data;
  loading a logical low into the second latch;
  applying the third verify voltage to the memory cell where the third verify voltage is greater than the second verify voltage;
  sensing the threshold voltage of the memory cell; and
  if the threshold voltage is greater than or equal to the third verify voltage, inhibiting further programming of the memory cell.

17. The method of claim 16 wherein the first verify voltage is between a first and a second multiple level cell state, the second verify voltage is between the second and a third multiple level cell state, and the third verify voltage is between the third and a fourth multiple level cell state.

18. The method of claim 16 and further including turning on a sense transistor, coupled between the first latch and the first and second pass transistors, each sensing of the threshold voltage.

19. The method of claim 16 and further including:
  performing a programming operation if the threshold voltage is less than the third verify voltage during the verifying of the second page with the third verify voltage,
  performing the programming operation if the threshold voltage is less than the second verify voltage during the verifying of the second page with the second verify voltage; and
  performing the programming operation if the threshold voltage is less than the first verify voltage during the verifying of the first page of data.

20. The method of claim 13 and further including determining if the second page passes a verify operation by:
  disabling the first pass transistor;
  enabling the second pass transistor;
  enabling a pull-down transistor; and
  determining a logical state of a verify match signal wherein the logical state of the verify match signal is indicative of the second page passing the verify operation.

21. The method of claim 20 and further including determining if the memory cell has been successfully programmed by:
  enabling the first and second pass transistors;
  enabling the pull down transistor; and
  determining the logical state of the verify match signal.

* * * * *

UNITED STATES PATENT AND TRADEMARK OFFICE
CERTIFICATE OF CORRECTION

| | | |
|---|---|---|
| PATENT NO. | : 8,004,892 B2 | Page 1 of 1 |
| APPLICATION NO. | : 12/632121 | |
| DATED | : August 23, 2011 | |
| INVENTOR(S) | : Tommaso Vali et al. | |

It is certified that error appears in the above-identified patent and that said Letters Patent is hereby corrected as shown below:

On the Title page, in field (75), in "Inventors", in column 1, line 3, delete "Gioia del Marsi" and insert -- Gioia dei Marsi --, therefor.

Signed and Sealed this

Eleventh Day of October, 2011

David J. Kappos
*Director of the United States Patent and Trademark Office*